United States Patent
Negishi

[11] Patent Number: 6,100,555
[45] Date of Patent: Aug. 8, 2000

[54] SEMICONDUCTOR DEVICE HAVING A PHOTOSENSITIVE ORGANIC FILM, AND PROCESS FOR PRODUCING THE SAME

[75] Inventor: Hitoshi Negishi, Tokyo, Japan

[73] Assignee: NEC Corporation, Tokyo, Japan

[21] Appl. No.: 09/432,128

[22] Filed: Nov. 2, 1999

[30] Foreign Application Priority Data

Nov. 2, 1998 [JP] Japan .................................. 10-312597

[51] Int. Cl.⁷ .................................................. H01L 29/812
[52] U.S. Cl. ............................................ 257/284; 257/280
[58] Field of Search .................................. 257/280, 281, 257/282, 283, 284

[56] References Cited

U.S. PATENT DOCUMENTS

| | | | |
|---|---|---|---|
| 5,448,086 | 9/1995 | Hida | 257/194 |
| 5,698,888 | 12/1997 | Fukaishi | 257/420 |
| 5,856,217 | 1/1999 | Nguyen et al. | 438/172 |
| 5,891,783 | 4/1999 | Lin et al. | 438/302 |

FOREIGN PATENT DOCUMENTS

| | | |
|---|---|---|
| 61-190985 | 8/1986 | Japan . |
| 4-167439 | 6/1992 | Japan . |
| 8-70012 | 3/1996 | Japan . |
| 9-172027 | 6/1997 | Japan . |

*Primary Examiner*—John Guay
*Attorney, Agent, or Firm*—Young & Thompson

[57] ABSTRACT

A recess is made in the semiconductor substrate. A gate electrode has a sectional shape of "T" to have a head overhanging portion and is made in the recess. The gate electrode having a head overhanging portion. A capacitance film is formed under the head overhanging portion of the gate electrode. An ohmic electrode is formed on the semiconductor substrate and at both sides of the gate electrode. In the device, the capacitance film is made of a photosensitive organic film having a smaller permittivity than that of silicon oxide films. This semiconductor device has a small gate parasitic capacitance and the variation in the capacitance can be reduced.

3 Claims, 6 Drawing Sheets

SEMICONDUCTOR DEVICE HAVING A PHOTOSENSITIVE ORGANIC FILM, AND PROCESS FOR PRODUCING THE SAME

BACKGROUND OF THE INVENTION

1. Field of the Invention

The present invention relates to a field-effect transistor (referred to as a FET hereinafter) having an ohmic electrode, and in particular to a semiconductor device having a photosensitive organic film causing its gate parasitic capacitance to be reduced and a method for producing the same.

2. Related Art

As semiconductor devices are made minute in recent years, electric signals propagating in wires of the semiconductor devices delay by the resistance of the wires or the capacitance between the wires. As the wire resistance or the capacitance between the wires is smaller, the delay of the electric signals becomes smaller. For this reason, it is important to make the gate parasitic capacitance small.

FIGS. 1A to 1E illustrate steps of producing the conventional semiconductor device having an ohmic electrode in the order of the steps. As shown in FIG. 1E, in a conventional semiconductor device 100 a recess 104 is made in a semiconductor substrate 101, and a gate electrode 106 in the form of "T" along a vertically sectional direction of the semiconductor substrate 101 is fitted to the recess 104. A protective film 107 having a uniform thickness is deposited on the semiconductor substrate 101 and the peripheral face of the gate electrode 106. Holes 109 are made at both sides of the gate electrode 106 and in parts of the protective film 107. Respective ohmic electrodes 110 are formed in the respective holes 109 in the manner that the electrodes 110 contact the semiconductor substrate 100 directly.

As illustrated in FIG. 1A, an oxide film of, for example, 4000 Å in thickness, as an insulating film 102, is first deposited on the semiconductor substrate 101. Thereafter, the insulating film 102 is subjected to dry-etching through a photoresist as a mask to make an opening 103 having an aperture size of, for example, 0.5 μm. Subsequently, the semiconductor substrate 101 is etched off by a thickness of, for example, 1000 Å to make the recess 104.

Next, as illustrated in FIG. 1B, a side wall oxide film 105 of, for example, 3000 Å in thickness is deposited. By such a side wall working, the aperture size of the opening 103 is reduced up to, for example, 0.2 μm. For example, WSi, as a gate metal, is then sputtered thereto to form the gate electrode 106.

Next, as illustrated in FIG. 1C, the insulating film 102 and the side oxide film 105 are wholly removed to reduce gate parasitic capacitance. Thereafter, a thin oxide or nitride film of, for example, 1000 Å in thickness is again deposited as the protective film 107.

Next, as illustrated in FIG. 1D, the holes 109 are made in the protective film 107, using a photoresist 108 as a mask.

Next, as illustrated in FIG. 1E, for example, AuGe for making the ohmic electrodes 110 is vapor-deposited into the holes 109 made in the protective film 107. The photoresist is lifted off to complete the semiconductor device 100.

In such a conventional semiconductor device, however, the gate parasitic capacitance varies in accordance with the thickness of the deposited oxide film or nitride film. As a result, there remains a problem that the performances of FETs vary largely.

It is general according to the above mentioned conventional producing process that after the gate electrode is formed, the oxide film formed under a head overhanging portion of the gate electrode is removed and then the thin oxide film or nitride film is deposited as the protective film. Since the oxide or nitride film remains as the protective film under the head overhanging portion of the gate electrode, there also arises a problem that the gate parasitic capacitance cannot be sufficiently reduced.

Furthermore, in the case that the oxide film on the portions where the ohmic electrodes should be formed is removed, the oxide film inside the recess is also etched by over-etching. In this way, a portion of the semiconductor substrate between the gate electrode and the recess is taken away. As a result, there is caused a problem that the performances of FETs vary.

SUMMARY OF THE INVENTION

It is an object of the present invention to provide a semiconductor device having a photosensitive organic film wherein the performance of the device as an FET is improved and the variation in the performance thereof is suppressed and a process for producing the same. That is, an object of the present invention is to reduce gate parasitic capacitance by using the photosensitive organic film as a capacitance film; protect, at the time of forming an ohmic electrode, the bottom face of a recess to prevent a semiconductor substrate from being taken away by forming the photosensitive organic film between the lower face of a head overhanging portion of a gate electrode and the bottom face of the recess; and remove a change in the gate parasitic capacitance, based on a change in the thickness of an oxide film under the head overhanging portion of the gate electrode, by not forming such an oxide film.

Thus, a semiconductor device according to the present invention comprises a semiconductor substrate; a recess made in the semiconductor substrate; a gate electrode which has a sectional shape of "T" so as to have a head overhanging portion and is made in the recess; a capacitance film formed under the head overhanging portion of the gate electrode; and an ohmic electrode formed on the semiconductor substrate and at both sides of the gate electrode; wherein the capacitance film is made of a photosensitive organic film having a smaller permittivity than that of silicon oxide films.

A process for producing a semiconductor device according to the present invention comprises:

the step of depositing an insulating film on a semiconductor substrate; the step of making an opening in a part of the insulating film; the step of making a recess in the opening; the step of forming a side wall oxide film on side walls of the opening; the step of fitting a gate electrode having a sectional shape of "T", so as to have a head overhanging portion, to the opening reduced by the side wall oxide film; the step of removing the insulating film and the side wall oxide film; the step of applying a photosensitive organic film having a smaller permittivity than that of silicon oxide films; the step of exposing the photosensitive organic film to light; and the step of removing the photosensitive organic film except the portion under the head overhanging portion of the gate electrode, thereby causing a capacitance film composed of the photosensitive organic film to remain under the head overhanging portion of the gate electrode.

The present invention may comprise, after the step of forming the photosensitive organic film except the portion under the head overhanging portion of the gate electrode, the steps of forming a protective film on the gate electrode and the semiconductor substrate, making a hole in the protective film, and fitting an ohmic electrode to the hole.

In the present invention, the ohmic electrode is preferably made of AuGe.

In the present invention, the photosensitive organic film is preferably one selected from the group consisting of a benzocyclobutene (BCB)-based photosensitive organic film, a polyimide-based photosensitive organic film, and a fluorine-based photosensitive organic film.

In the present invention, the photosensitive organic film having a lower permittivity than that of silicon oxide films is formed under the head overhanging portion of the gate electrode. Therefore, in the case that the ohmic electrode is made by lifting off, any oxide film is not made under the head overhanging portion of the gate electrode. Accordingly, the gate parasitic capacitance is made small to improve the performance of the FET.

In the present invention, the capacitance film composed of the photosensitive organic film is formed under the head overhanging portion of the gate electrode. The gate electrode is covered with the protective film composed of an oxide film or the like. That is, any oxide film is not present under the head overhanging portion of the gate electrode; therefore, the gate parasitic capacitance is not changed by a change in the thickness of any oxide film. As a result, the variation in the performances of FETs can be suppressed.

DESCRIPTION OF PREFERRED
EMBODIMENTS OF THE INVENTION

Figure 1A:
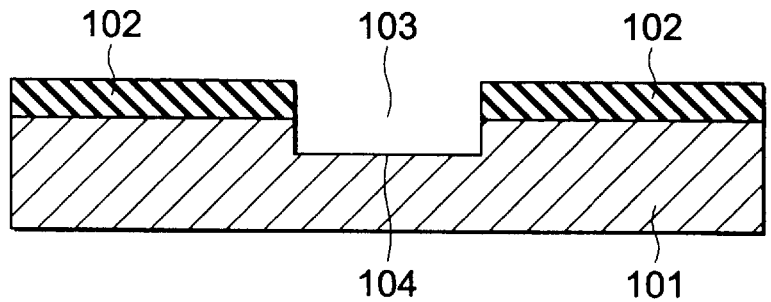
FIGS. 1A to 1E are sectional views illustrating the steps of producing a conventional semiconductor device in the order of the steps.
Figure 1B:
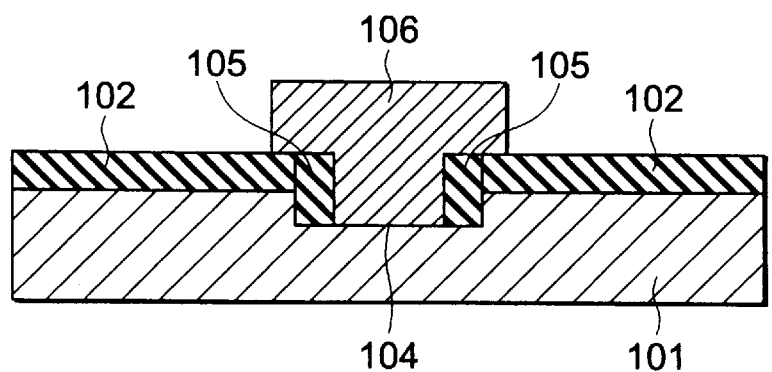
Figure 1C:
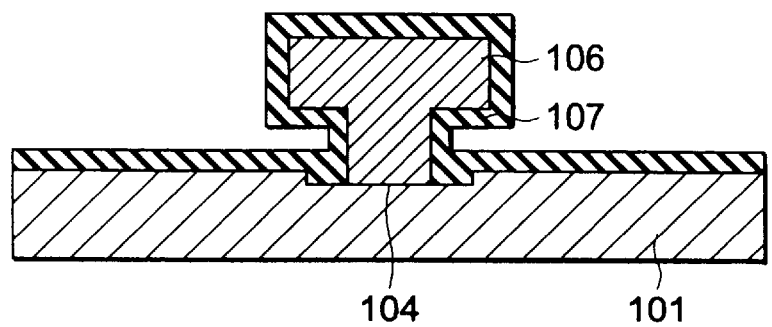
Figure 1D:
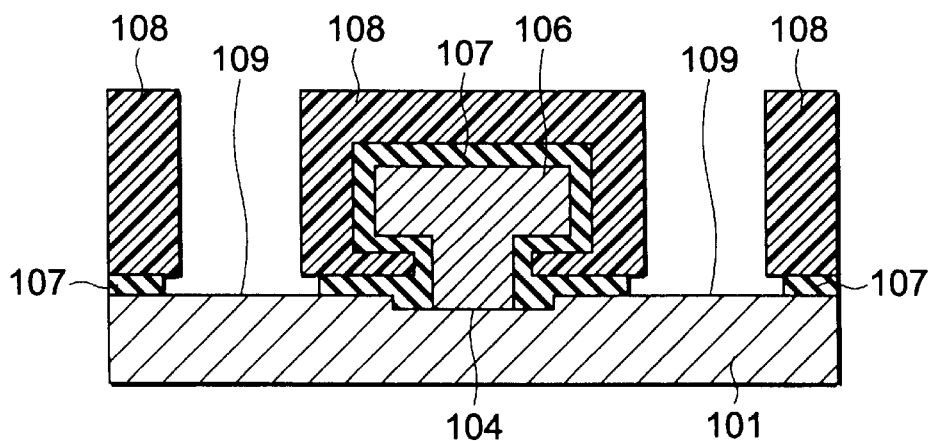
Figure 1E:
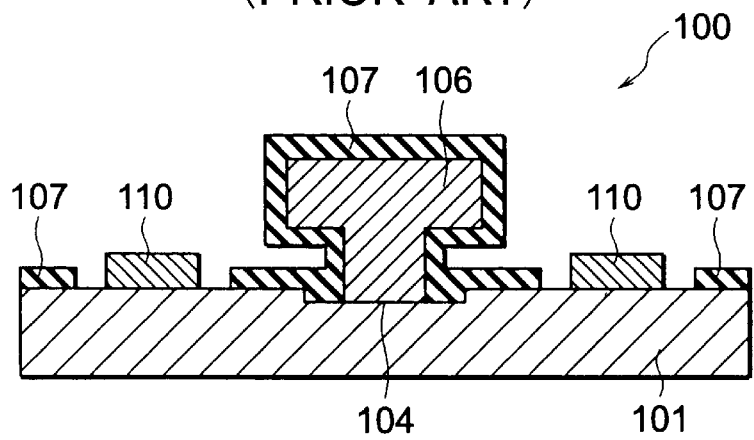
Figure 2:
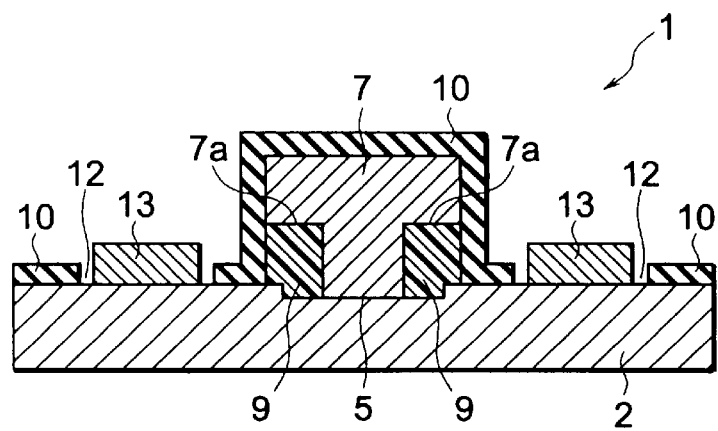
FIG. 2 is a sectional view of a semiconductor device having a photosensitive organic film according to an embodiment of the present invention.

Referring to the attached drawings, the semiconductor device having a photosensitive organic film according to the preferred embodiment of the present invention will be described more specifically. FIG. 2 is a sectional view of a semiconductor device 1 having a photosensitive organic film according to an embodiment of the present invention.

In this semiconductor device 1, a recess 5 is made in a central portion of a semiconductor substrate 2. A gate electrode 7 having a shape of "T" along a vertically sectional direction of the semiconductor substrate 2 is fitted to this recess 5. A capacitance film 9 is formed under a head overhanging portion 7a of this gate electrode 7. This capacitance film 9 is composed of a photosensitive organic film 8 having a smaller permittivity than that of silicon oxide films. This photosensitive organic film 8 is made of, for example, BCB (benzocyclobutene). The gate electrode 5 contacts the bottom face of the recess 5 directly. That is, the capacitance film 9 is formed between the lower face of the head overhanging portion 7a of the gate electrode 7 and the recess 5. Furthermore, the semiconductor substrate 2 and the gate electrode 7 are covered with a protective film 10. At both sides of the gate electrode 7, ohmic electrodes 19 are formed in holes made by removing parts of the protective film 10 in the manner that the ohmic electrodes 19 contact the semiconductor substrate 2 directly.

According to the above mentioned structure, the capacitance film 9 composed of the photosensitive organic film 8 is formed under the head overhanging portion 7a of the gate electrode 7. This photosensitive organic film 8 has a permittivity $\epsilon$ of about 2, which is lower than the permittivity $\epsilon$ of the silicon oxide film formed as the protective film 10 (that is, about 4). Thus, the gate parasitic capacitance is reduced to ½. By this, its frequency characteristics can also be improved. For examples, its cut-off frequency fT can be raised from 50 GHz to 70 GHz, and maximum oscillation frequency can be raised from 80 GHz to 100 GHz.

The following will describe a process for producing the semiconductor device according to the embodiment of the present invention, referring to FIGS. 3A to 3E. FIGS. 3A to 3E are sectional views illustrating the process of producing the semiconductor device according to the embodiment of the present invention in the order of its steps.

Figure 3A:
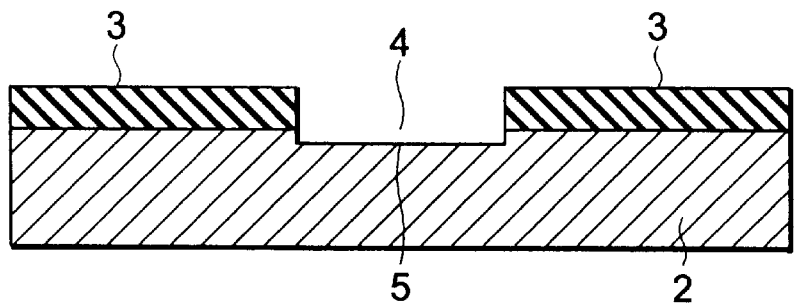
FIGS. 3A to 3E are sectional views illustrating the process for producing the semiconductor device according to the embodiment of the present invention in the order of its steps.

As illustrated in FIG. 3A, a silicon oxide film of, for example, 4000 Å in thickness, as an insulating film 3, is first deposited on the semiconductor substrate 2. Thereafter, the insulating film 3 is subjected to dry-etching through a photoresist as a mask to make an opening 4 having an aperture size of, for example, 0.5 $\mu$m. Subsequently, the semiconductor substrate 2 is etched off by a thickness of, for example, 1000 Å to make the recess 5.

Figure 3B:
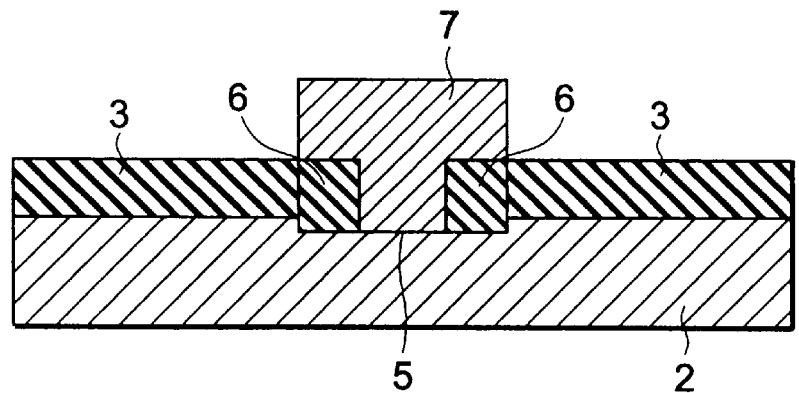

Next, as illustrated in FIG. 3B, a side wall oxide film 6 of, for example, 3000 Å in thickness is deposited. By such a side wall working, the aperture size of the opening 4 is reduced up to, for example, 0.2 $\mu$m. For example, WSi, as a gate metal, is sputtered thereto to form the gate electrode 7.

Figure 3C:
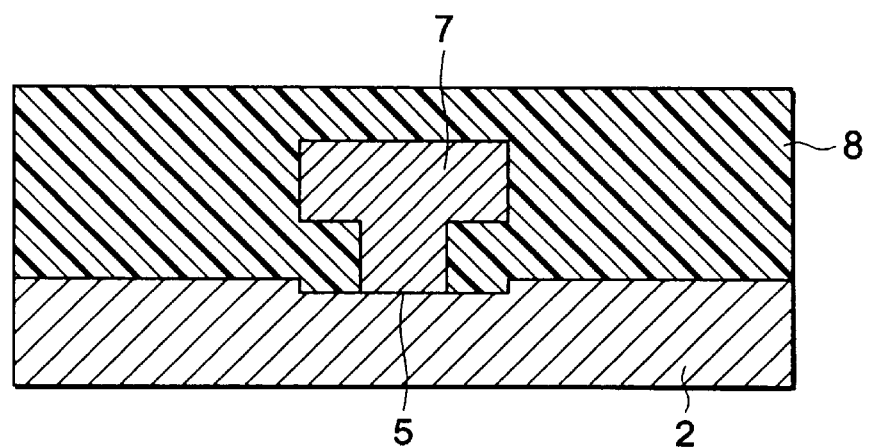

Next, as illustrated in FIG. 3C, the insulating film 3 and the side oxide film 6 are wholly removed, and then, for example, BCB is applied thereto as the photosensitive organic film 8.

Figure 3D:
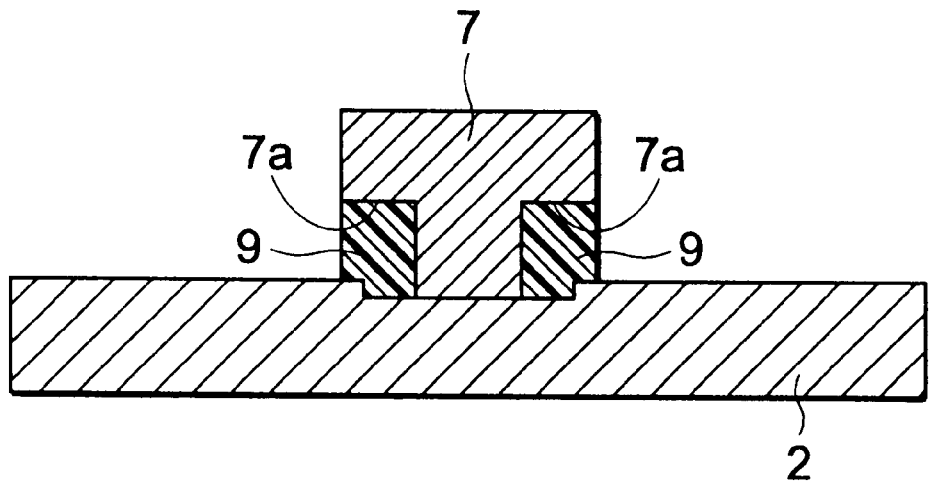

Next, as illustrated in FIG. 3D, the entire face of the photosensitive organic film 8 is exposed to light. Since the portion under the head overhanging portion 7a of the gate electrode 7 is not exposed to the light, the photosensitive organic film 8, which will become the capacitance film 9, remains only under the head overhanging portion 7a of the gate electrode 7.

Figure 3E:
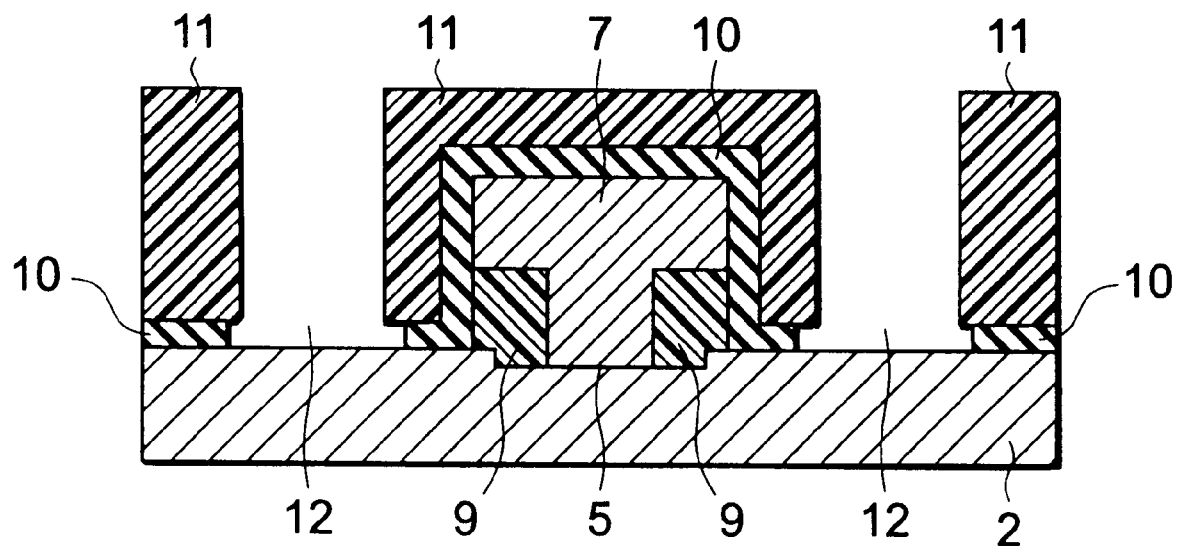

Next, as illustrated in FIG. 3E, a silicon oxide film of, for example, 1000 Å in thickness is deposited as the protective film 10 on the semiconductor substrate 2. For patterning, a photoresist 11 is applied to the entire face of the protective film 10. Using this photoresist 11 as a mask, holes 12 are made in the protective film 10 and at both sides of the gate electrode 7.

Finally, for example, AuGe for making the ohmic electrodes 13 is vapor-deposited into the holes 12. The photoresist is lifted off to complete the semiconductor device 1 illustrated in FIG. 2.

In this way, the recess 5 is made in the semiconductor substrate 2, and the gate electrode 7 having a shape of "T" along a vertically sectional direction of the semiconductor substrate 2 is fitted to the bottom face of the recess 5. Besides, the capacitance film 9 made of the photosensitive organic film 8 is formed under the head overhanging portion 7a of the gate electrode 7. By such a structure, the gate parasitic capacitance does not vary even if the thickness of the oxide film as the protective film 10 is changed. In the case that the holes 12 are made in the protective film 10 at the positions where the ohmic electrodes 13 should be made, there does not arise a phenomenon that silicon crystal is taken away at portions of the semiconductor substrate inside the recess 5 by over-etching. The variation in the performance of the semiconductor device can be reduced.

The following will specifically describe another embodiment of the present invention, referring to FIGS. 4A to 4F. To the same members or elements as in the embodiment illustrated in FIGS. 2 and 3A to 3E, the same reference numbers are attached, so as to omit detailed explanation on them. FIGS. 4A to 4F are sectional views illustrating the process for producing the semiconductor device according to the embodiment of the present invention in the order of its steps.

The present embodiment is different from the above mentioned embodiment having a single recess structure that the single recess 5 is made in the semiconductor substrate 2, and the present embodiment has a double recess structure that a second recess 15 is made inside a first recess 14 made in the semiconductor substrate 2. Other elements or members are the same as in the above mentioned embodiment.

According to this structure, the capacitance film 9 composed of the photosensitive organic film 8 is formed between the lower face of the head overhanging portion 7a of the gate electrode 7 and the first and second recesses 14 and 15 in the same way as in the above mentioned embodiment. This photosensitive organic film 8 has a permittivity $\epsilon$ of about 2, which is lower than the permittivity $\epsilon$ of the silicon oxide film formed as the protective film 10 (that is, about 4). Thus, the gate parasitic capacitance is reduced to ½. By this, its frequency characteristics can also be improved. For examples, its cut-off frequency fT can be raised from 40 GHz to 60 GHz, and maximum oscillation frequency can be raised from 70 GHz to 90 GHz.

The following will describe a process for producing the semiconductor device according to the embodiment of the present invention, referring to FIGS. 4A to 4F.

Figure 4A:
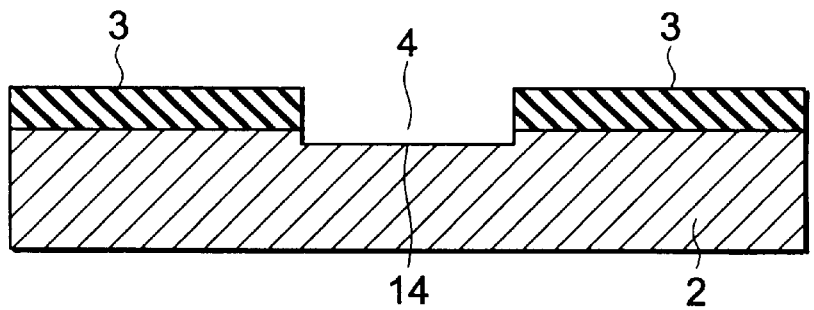
FIGS. 4A to 4F are sectional views illustrating the process for producing a semiconductor device according to another embodiment of the present invention in the order of its steps.

As illustrated in FIG. 4A, a silicon oxide film of, for example, 4000 Å in thickness, as an insulating film 3, is first deposited on the semiconductor substrate 2. Thereafter, the insulating film 3 is subjected to dry-etching through a photoresist as a mask to make an opening 4 having an aperture size of, for example, 0.9 μm. Subsequently, the semiconductor substrate 2 is etched off by a thickness of, for example, 800 Å to make the first recess 14.

Figure 4B:
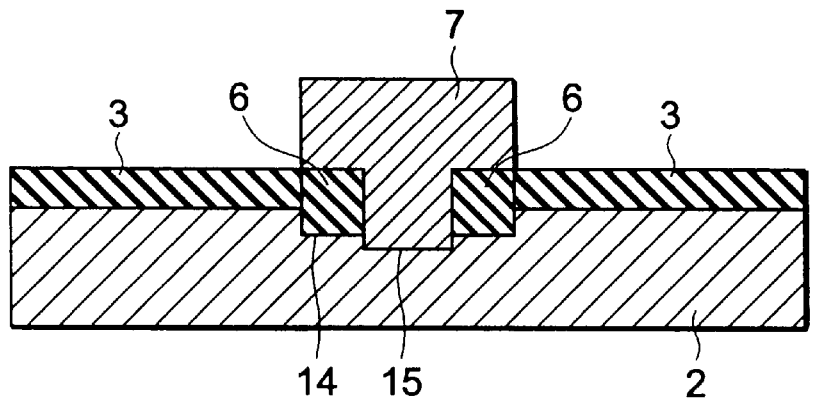

Next, as illustrated in FIG. 4B, a side wall oxide film 6 of, for example, 5000 Å in thickness is deposited. By such a side wall working, the aperture size of the opening 4 is reduced up to, for example, 0.4 μm. Subsequently, the semiconductor substrate 2 is etched off by a thickness of, for example, 200 Å to make the second recess 15. For example, WSi, as a gate metal, is then sputtered thereto to form the gate electrode 7.

Figure 4C:
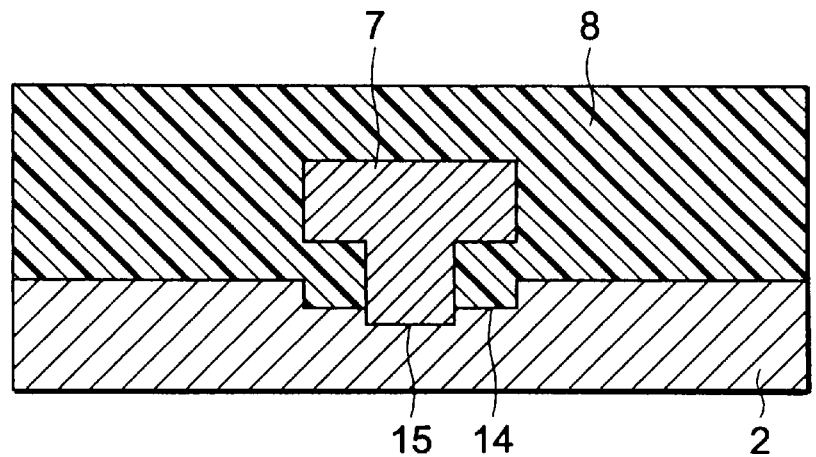

Next, as illustrated in FIG. 4C, the insulating film 3 and the side oxide film 6 are wholly removed to reduce gate parasitic capacitance, and then the photosensitive organic film 8, which has a lower permittivity than that of silicon oxide films, is applied thereto. As the photosensitive organic film 8, for example, BCB is used.

Figure 4D:
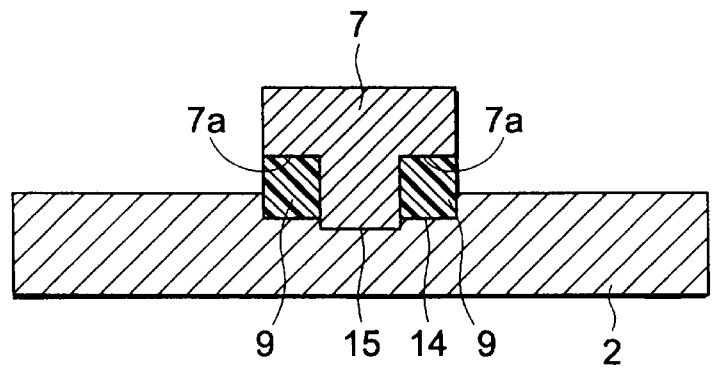

Next, as illustrated in FIG. 4D, the entire face of the photosensitive organic film 8 is exposed to light. Since the portion under the head overhanging portion 7a is not exposed to the light, the photosensitive organic film 8 remains only under the head overhanging portion 7a of the gate electrode 7. In this way, the capacitance film 9 is formed.

Figure 4E:
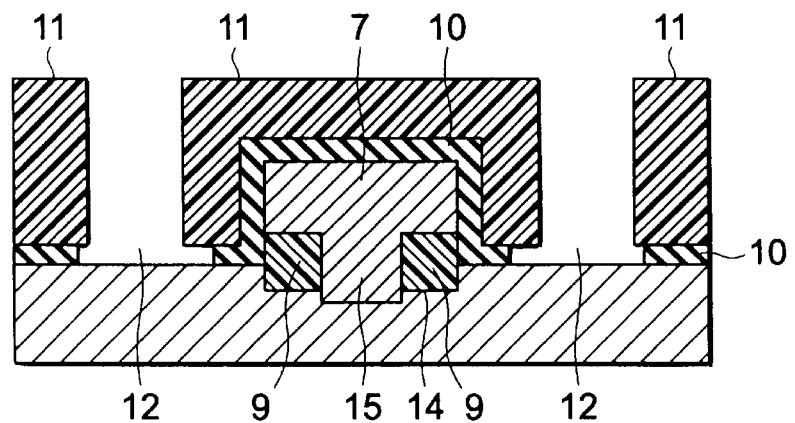

Next, as illustrated in FIG. 4E, a silicon oxide film of, for example, 1000 Å in thickness is deposited as the protective film 10 thereon. Using a photoresist 11 as a mask, holes 12 are made in the protective film 10.

Figure 4F:
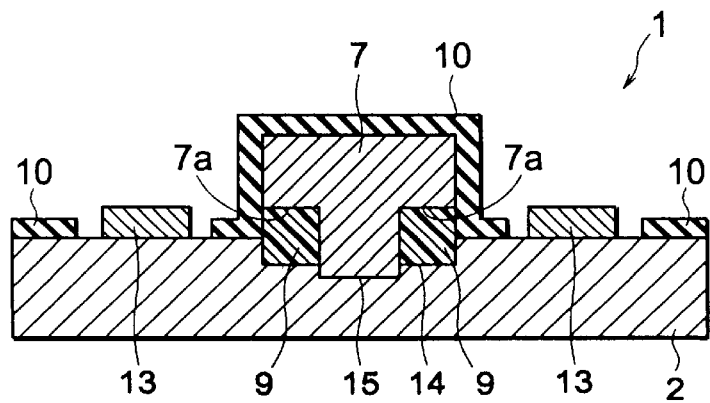

Next, as illustrated in FIG. 4F, for example, AuGe for making the ohmic electrodes 13 is vapor-deposited. The photoresist is lifted off to complete the semiconductor device 1.

In the present embodiment, the photosensitive organic film 8 is formed between the lower face of the head overhanging portion 7a of the gate electrode 7 and the first and second recesses 14 and 15. Therefore, the gate parasitic capacitance does not vary even if the thickness of the oxide film as the protective film 10 is changed. Furthermore, there does not arise a phenomenon that silicon crystal is taken away at portions of the semiconductor substrate inside the first and second recesses 14 and 15 by over-etching of any oxide film. Thus, the variation in the performance of the semiconductor device 1 can be reduced.

In any one of the above mentioned embodiments, the photosensitive organic film 8 is not limited to the BCB film, and may be a polyimide-based or fluorine-based photosensitive organic film. Any one of these substances has a smaller permittivity than that of silicon oxide films and silicon nitride films.

In any one of the above mentioned embodiments, the protective film is not limited to the silicon oxide film, and may be a SiN or SiON film.

In any one of the above mentioned embodiments, the gate electrode having a sectional shape of "T" along a vertically sectional direction of the semiconductor substrate 2 is fitted to the bottom face of the recess 5. The shape of the gate electrode 7 is not limited to this shape, and may be appropriately changed in accordance with the specification or producing process thereof.

What is claimed is:

1. A semiconductor device, comprising:
   a semiconductor substrate;
   a recess made in the semiconductor substrate;
   a gate electrode which has a sectional shape of "T" so as to have a head overhanging portion and is made in the recess;
   a capacitance film formed under the head overhanging portion of the gate electrode, the capacitance film being made of a photosensitive organic film having a smaller permittivity than that of silicon oxide films; and
   an ohmic electrode formed on the semiconductor substrate and at both sides of the gate electrode.

2. The semiconductor device according to claim 1, wherein the photosensitive organic film is one selected from the group consisting of a benzocyclobutene (BCB)-based photosensitive organic film, a polyimide-based photosensitive organic film, and a fluorine-based photosensitive organic film.

3. The semiconductor device according to claim 1, wherein the ohmic electrode is made of AuGe.

* * * * *